United States Patent [19]
Horimoto

[11] Patent Number: 5,946,358
[45] Date of Patent: Aug. 31, 1999

[54] RECEIVER CIRCUIT FOR A MOBILE COMMUNICATIONS SYSTEM

[75] Inventor: Masashi Horimoto, Kyoto, Japan

[73] Assignee: Rohm Co., Ltd., Kyoto, Japan

[21] Appl. No.: 08/951,519

[22] Filed: Oct. 16, 1997

[30] Foreign Application Priority Data

Oct. 16, 1899 [JP] Japan ..................................... 8-273321

[51] Int. Cl.[6] .............................. H03K 9/00; H04L 27/06; H04B 1/18; H03D 1/00
[52] U.S. Cl. .......................... 375/316; 375/344; 375/362; 455/192.1; 455/259; 331/1 A; 329/358
[58] Field of Search ..................... 375/316, 356, 375/317, 344, 362, 364; 455/192.1, 192.2, 259, 260; 331/1 A, 14; 327/156; 329/315, 323, 336, 346, 350, 358, 304, 310

[56] References Cited

U.S. PATENT DOCUMENTS 4,825,437 4/1989 Balech ..................................... 370/104
5,436,591 7/1995 Henze ..................................... 329/304
5,724,360 3/1998 Lundh et al. ............................ 370/516

*Primary Examiner*—Chi H. Pham
*Assistant Examiner*—Khai Tran
*Attorney, Agent, or Firm*—Nikaido, Marmelstein, Murray & Oram LLP

[57] ABSTRACT

A PHS relay station demodulates a digital signal from a received radio-frequency signal by use of a reproduction clock produced from the digital signal. The relay station has an oscillator which generates a clock and a variable-ratio frequency divider for the clock outputted from the oscillator. A bit clock is produced from the output of the divider. A signal processor processes the digital signal by use of the bit clock. A detector detects a specific code in the digital signal in synchronism with the bit clock. The length of time that passes after the specific code detection signal is generated until the reproduction clock changes its level is detected as the phase deviation between the reproduction clock and the bit clock. The phase deviation is eliminated by temporarily changing the frequency division ratio of the divider in accordance with the amount of the deviation.

6 Claims, 6 Drawing Sheets

RECEIVER CIRCUIT FOR A MOBILE COMMUNICATIONS SYSTEM

BACKGROUND OF THE INVENTION

1. Field of the Invention

The present invention relates to a receiver circuit for use in a relay station or in a mobile or portable terminal for a mobile communications system such as Personal Handy-phone System (PHS).

2. Description of the Prior Art

In a mobile communications system such as Personal Handy-phone System, a base station, a relay station, and a portable terminal are interrelated as follows. The base station and the portable terminal communicate with each other by radio. The base station is installed, for example, at a pay-phone booth, and is linked to a land-based communications system (telephone network) across an ISDN line. In a situation where the portable terminal finds difficulty in establishing communication, as when it is used indoors, a relay station is installed, for example, by the side of a window of a building. In this case, the base station and the portable terminal communicate with each other through the relay station.

A conventional relay station operates as follows. A PHS signal received by the relay station through its antenna is fed to a radio-frequency circuit for amplification and other processing. Then, the received signal is demodulated by a demodulator into received data and a reproduction clock having a frequency of 384 kHz. Thereafter, the received data and the reproduction clock are fed to a succeeding processing circuit.

The demodulator requires a clock having a frequency higher than the reproduction clock for its operation. Accordingly, a temperature-compensated quartz-crystal oscillator (hereafter referred to as a "TCXO") is used. The TCXO outputs a clock having a frequency of 19.2 MHz. This clock is fed to the demodulator, and separately to an operation-clock generating circuit. The operation-clock generating circuit generates a bit clock having a frequency of 384 kHz through 1/50 frequency division of the 19.2 MHz clock and a frame synchronization clock having a frequency of 200 Hz through 1/96,000 frequency division of the 19.2 MHz clock.

The bit clock and the frame synchronization clock are fed to the processing circuit mentioned above. The processing circuit processes the received data by the use of the bit clock and the frame synchronization clock.

However, the base station and the relay station operate on the basis of independent clocks. In the relay station, the reproduction clock is produced from a signal transmitted from the base station, whereas the bit clock is produced through frequency division of the 19.2 MHz clock of the TCXO.

As a result, in the relay station, if the TCXO generates the clock at a deviated frequency, the reproduction clock does not synchronize exactly with the bit clock. This may result in data errors. Moreover, even if the reproduction clock and the bit clock have just the same frequency, they may have a phase difference. Such a phase difference remains uncorrected during signal processing, and makes the base station and the relay station distinguishable from each other in terms of their signals on the part of the portable terminal. This, however, is undesirable, because, ideally, the base station and the relay station should be treated with equity in terms of their signals on the part of the portable terminal.

SUMMARY OF THE INVENTION

An object of the present invention is to provide a receiver circuit for a mobile communications system that actively attempts to keep a bit clock in exact synchronism with a reproduction clock.

Another object of the present invention is to provide a receiver circuit for a mobile communications system that enables a portable terminal to treat signals from a base station and signals from a relay station with equity.

BRIEF DESCRIPTION OF THE DRAWINGS

This and other objects and features of this invention will become clear from the following description, taken in conjunction with the preferred embodiments with reference to the accompanied drawings in which.

DESCRIPTION OF THE PREFERRED EMBODIMENTS

Figure 8:
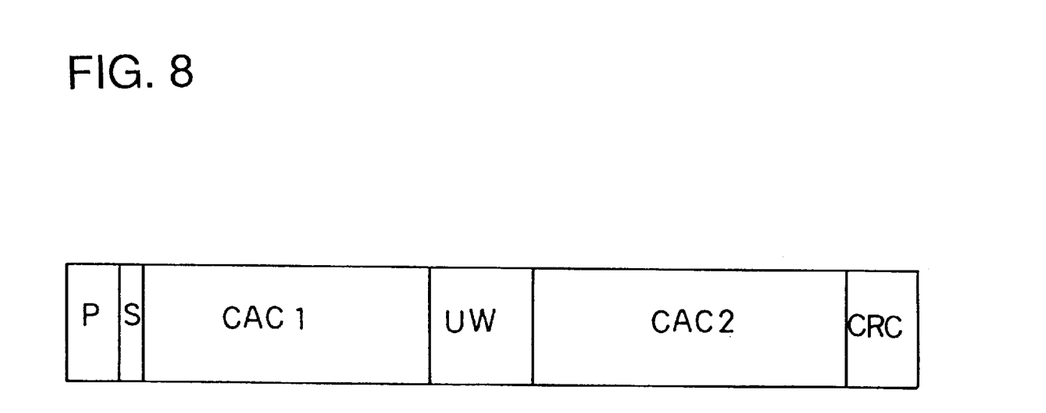
FIG. 8 is a diagram showing the data format used in Personal Handyphone System.

Hereinafter, an embodiment of the present invention will be described with reference to the drawings. Here, we take up Personal Handyphone System (PHS) as an example of a mobile communications system. FIG. 8 shows an example of the data format used in PHS. As shown in FIG. 8, a minimum significant unit of communicated data is composed of the following data blocks: a header block P consisting of 4 bits that serves to turn the power on without causing an abrupt rise of voltage, a start symbol SS consisting of 2 bits, a control data block CAC1 consisting of 62 bits, a unique word UW consisting of 32 bits, an audio data block CAC2 consisting of 124 bits, and an error correction data block CRC consisting of 16 bits.

Figure 7:
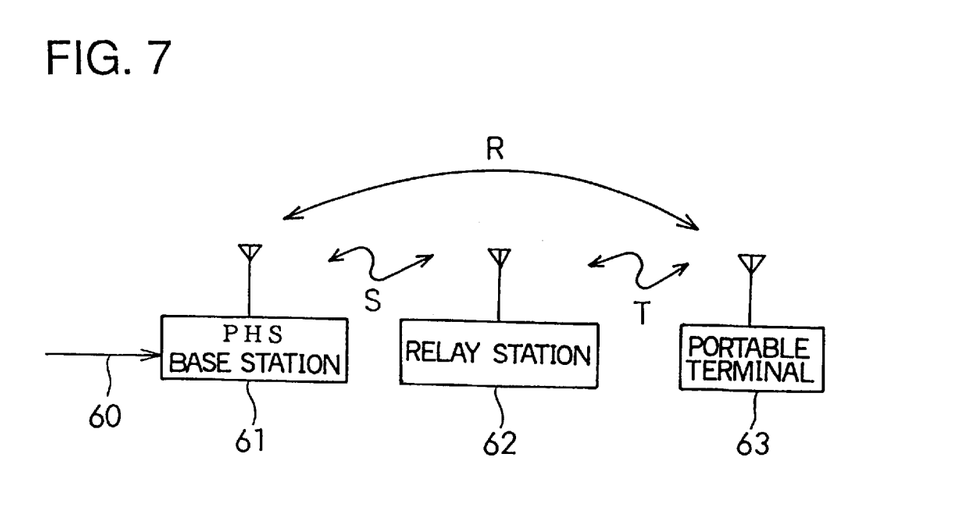
FIG. 7 is a diagram showing the relationship between a base station, a relay station, and a portable terminal in Personal Handyphone System.

FIG. 7 shows the relationship between a base station 61, a relay station 62, and a portable terminal 63. In FIG. 7, numeral 60 represents an ISDN line; arrow R indicates the route by which the base station 61 communicates directly with the portable terminal 63, arrow S indicates the route by which the base station 61 communicates with the relay station 62, and arrow T indicates the route by which the relay station 62 communicates with the portable terminal 63.

Figure 1:
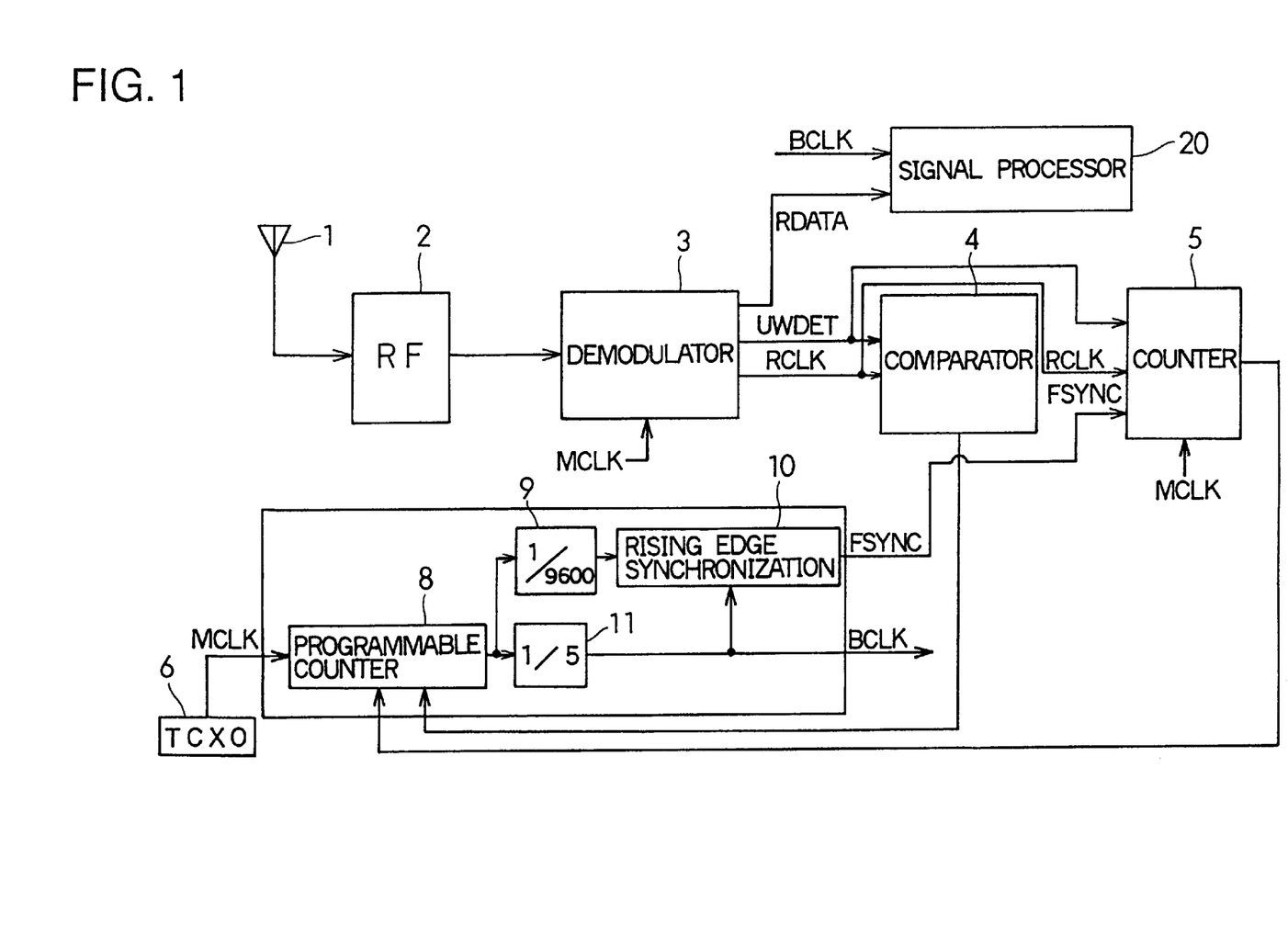
FIG. 1 is a block diagram of a receiving circuit embodying the present invention for use in a relay station of Personal Handyphone System.

FIG. 1 is a block diagram schematically showing the construction of a relay station 62 embodying the present invention. A radio-frequency signal carrying PHS data is received through the antenna 1. The received radio-frequency signal is fed first to an radio-frequency circuit 2 for amplification, and then to a demodulator 3.

Figure 4:
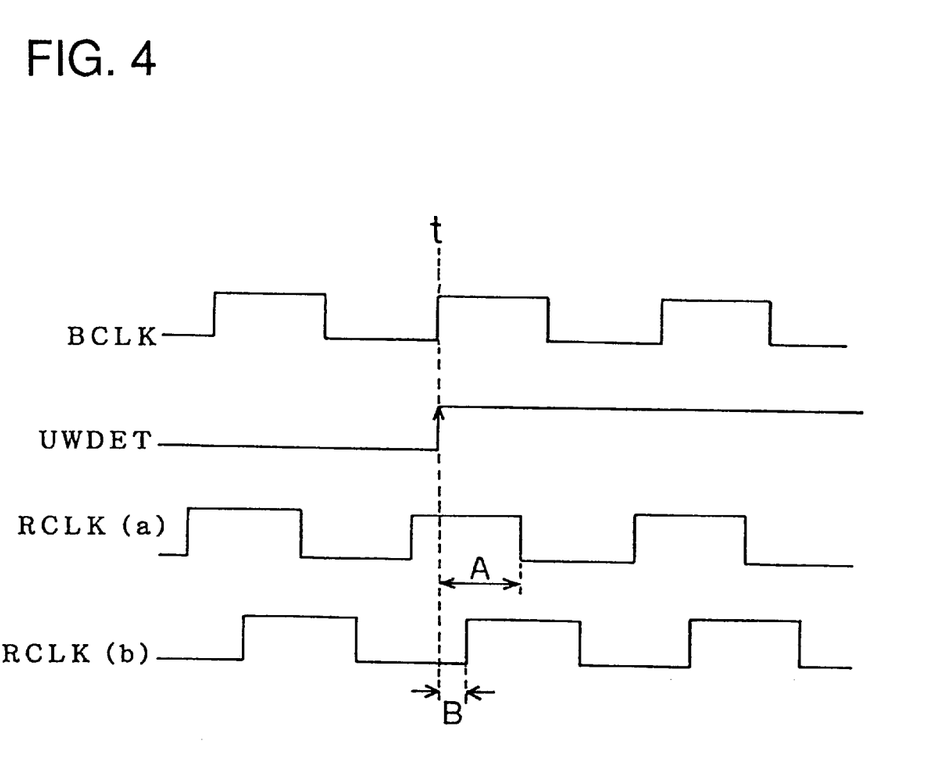
FIG. 4 is a diagram illustrating how inexactness of synchronism is evaluated.

The demodulator 3 operates in synchronism with a clock MCLK having a frequency of 19.2 MHz. The clock MCLK is generated by a TCXO 6. Moreover, the demodulator 3 produces a reproduction clock RCLK having a frequency of 384 kHz from the received signal, and, by using this reproduction signal RCLK, demodulates received data RDATA from the received signal. The demodulated data RDATA is fed to a signal processor 20. Furthermore, the demodulator 3 feeds the reproduction clock RCLK to a comparator 4 and a counter 5. In addition, when the demodulator 3 detects the unique word UW (a specific code), shown in FIG. 8, included in the received signal, it generates a unique word detection signal UWDET and feeds it to the comparator 4 and the counter 5. As shown in FIG. 4 described later, the unique word detection signal UWDET is generated in synchronism with a bit clock BCLK.

Figure 2:
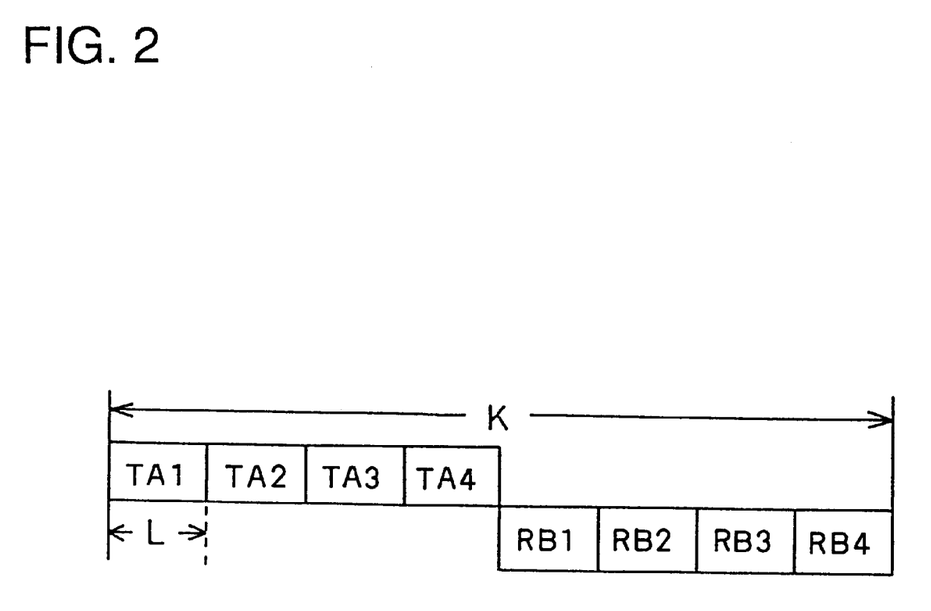
FIG. 2 is a diagram showing a series of data communicated in Personal Handyphone System.

As shown in FIG. 2, communication of PHS is performed frame by frame. One frame K lasts for 5 ms and consists of eight slots, each lasting for 625 $\mu$s and containing the data blocks shown in FIG. 8. Within one frame K, four transmission slots TA1 to TA4 and four reception slots RB1 to RB4 are allocated to achieve four-channel multiplex communication. One slot lasts for 625 $\mu$s and contains 240 bits of data. Accordingly, in this case, communication of data needs to be processed in synchronism with a bit clock BCLK having a frequency of 385 kHz.

In FIG. 1, the TCXO 6 generates the clock MCLK having a frequency of 19.2 MHz and feeds it to an operation-clock generating circuit 7. Within the operation-clock generating circuit 7, the clock MCLK is subjected first to frequency division by a programmable counter 8, and then to $\frac{1}{5}$ frequency division by a frequency divider 11. In this way, a bit clock BCLK (see FIG. 4) having a frequency of 385 kHz is produced. The bit clock BCLK is fed to the signal processor 20.

The output of the programmable counter 8 is subjected to $\frac{1}{9,600}$ frequency division by another frequency divider 9 as well. Then, the rising edges of the pulses outputted from the frequency divider 9 are brought into synchronism with the rising edges of the bit clock BCLK by a rising-edge synchronizing circuit 10. In this way, a frame synchronization clock FSYNC is produced. The frame synchronization clock FSYNC is fed to the counter 5 described later.

Every time the unique word detection signal UWDET rises, the comparator 4 compares rising edges of the reproduction clock RCLK and the bit clock BCLK. Specifically, this is achieved simply by checking whether the reproduction clock RCLK is in a high-level or low-level state when the unique word detection signal UWDET rises, since the unique word detection signal UWDET is generated in synchronism with the bit clock BCLK. In this way, it is possible to judge whether the bit clock BCLK is advanced or delayed relative to the reproduction clock RCLK in terms of their phases. The result of this judgment is fed to the programmable counter 8.

Moreover, the rising edge of the unique word detection signal UWDET is used also by the counter 5 in order to determine the deviation of the reproduction clock RCLK relative to the bit clock BCLK. Specifically, this is achieved by counting pulses of the clock MCLK from the time point when the unique word detection signal UWDET rises to the time point when the reproduction clock RCLK changes its state. The count is held in temporary storage until it is fed to the programmable counter 8 in synchronism with the frame synchronization clock FSYNC. In response, the programmable counter 8 changes its frequency division ratio, thereby to bring the bit clock BCLK into exact synchronism with the reproduction clock RCLK.

The detection of the direction and amount of the deviation between the clocks is achieved in the following manner. FIG.4 shows examples of the waveforms of the related clocks and signal. The unique word detection signal UWDET is generated in synchronism with a rising edge of the bit clock BCLK. As the waveform RCLK(a) in FIG. 4 shows, in a case where the bit clock BCLK is delayed relative to the reproduction clock RCLK, the reproduction clock RCLK is in a high-level state at the time point t when the unique word detection signal UWDET rises.

In this case, the counter 5 counts pulses in the clock MCLK during the time period A, i.e from the time point t to the time point when the reproduction clock RCLK drops to a low-level state, and the degree of the delay of the bit clock BCLK is calculated as 25 — (the count obtained during the period A). In this expression, the value 25 is the count that corresponds to the pulse width of RCLK.

Similarly, as the waveform RCLK(b) in FIG. 4 shows, in a case where the bit clock BCLK is advanced relative to the reproduction clock RCLK, the reproduction clock RCLK is in a low-level state at the time point t. In this case, the counter 5 the time point t to the time point when the reproduction clock RCLK rises to a high-level state, and the degree of the advancement of the bit clock BCLK is calculated as the count obtained during the period B.

Figure 3:
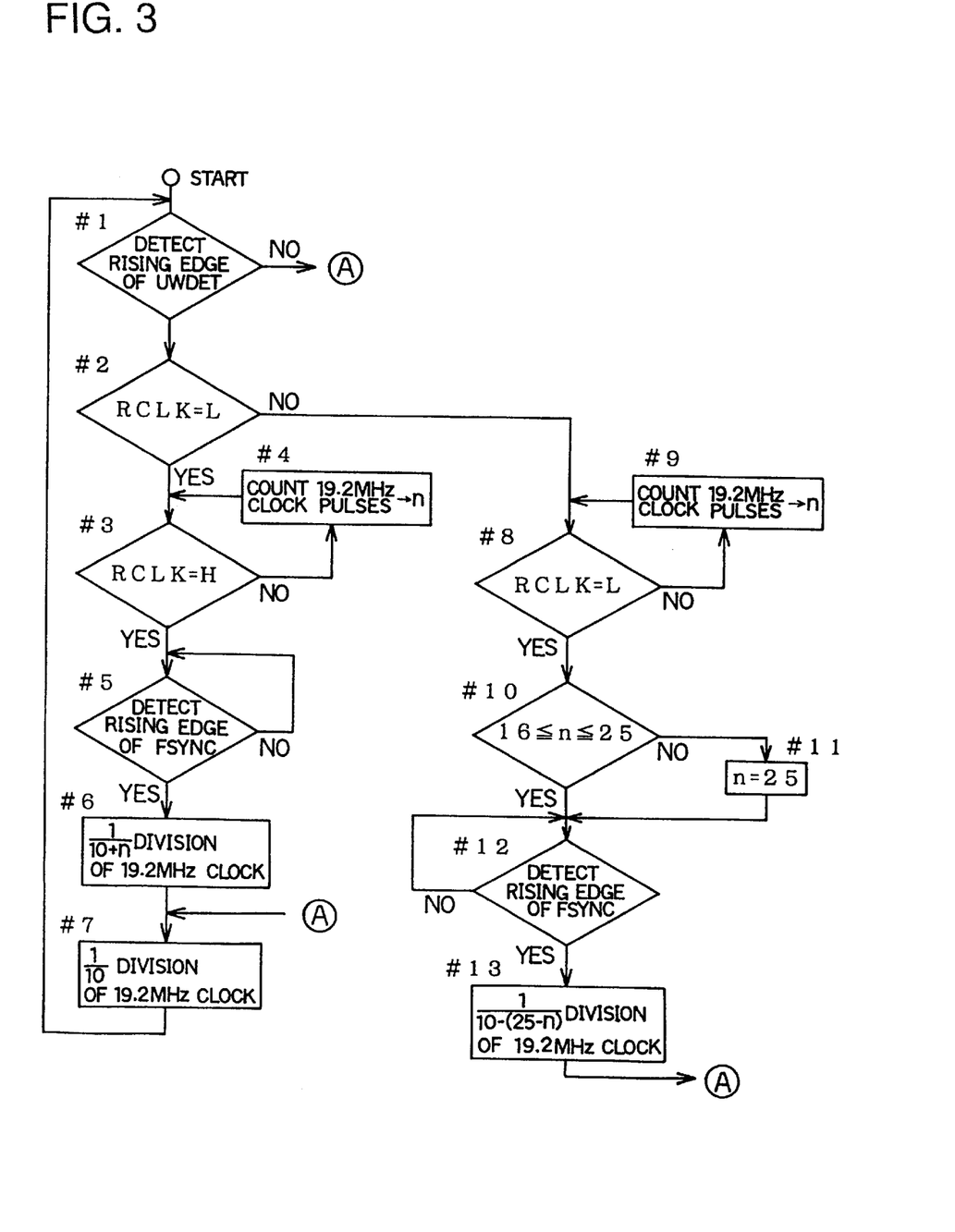
FIG. 3 is a flowchart showing the procedure for keeping exact synchronism.

FIG. 3 is a flowchart showing the procedure for keeping exact synchronism. At the start of the procedure, in step #1, the comparator 4 (see FIG. 1) attempts to detect the rising edge of the unique word detection signal UWDET. If it is not detected, the procedure proceeds to step #7 to subject the 19.2 MHz clock MCLK to $\frac{1}{10}$ frequency division by the programmable counter 8. Then, the procedure returns to step #1.

If, in step #1, the rising edge of the unique word detection signal UWDET is detected, the procedure proceeds to step #2 to determine whether the reproduction clock RCLK is in the low-level state.

If, in step #2, the reproduction clock RCLK is found to be in a low-level state, the procedure proceeds to step #3. This means, as described previously, that the bit clock BCLK is advanced relative to the reproduction clock RCLK. In step #3, whether the reproduction clock RCLK is in a high-level state or not is determined.

If, in step #3, the reproduction clock RCLK is found to be not in a high-level state, the procedure proceeds to step #4 to cause the counter 5 (see FIG. 1) to start counting pulses in the 19.2 MHz clock MCLK. The counting is continued until, in step #3, the reproduction clock RCLK is found to be in a high-level state. When the reproduction clock RCLK is found to be in a high-level state, the counting that was started in step #4 is stopped, and the count n at that moment is stored in the counter 5.

When, in step #3, the reproduction clock RCLK is found to be in a high-level state, the procedure proceeds to step #5. In step #5, the counter 5 attempts to detect a rising edge of the frame synchronization clock FSYNC. If it is not detected, the operation of step #5 is repeated until it is detected.

If, in step #5, a rising edge of the frame synchronization clock FSYNC is detected, the counter 5 outputs the stored count n, and the procedure proceeds to step #6. In step #6, the obtained count is used to subject, only once, the 19.2 MHz clock MCLK to 1/(10+n) frequency division by the programmable counter 8 (see FIG. 1), Thereafter, in step #7, the 19.2 MHz clock MCLK is subjected to $\frac{1}{10}$ frequency division by the programmable counter 8. Then, the procedure returns to step #1.

If, in step #2, the reproduction clock RCLK is found to be in a high-level state, the procedure proceeds to step #8. In this case, the bit clock BCLK is delayed relative to the reproduction clock RCLK. In step #8, whether the reproduction clock RCLK is in a low-level state or not is determined.

If, in step #8, the reproduction clock RCLK is found to be not in a low-level state, the procedure proceeds to step #9 to cause the counter 5 to start counting pulses in the 19.2 MHz clock MCLK. The counting is continued until, in step #8, the reproduction clock RCLK is found to be in a low-level state. When the reproduction clock RCLK is found to be in a low-level state, the counting is stopped, and the count n at that moment is stored.

When, in step #8, the reproduction clock RCLK is found to be in a low-level state, the procedure proceeds to step #10. In step #10, whether the count n is in a range between 16 and 25 is determined. If the count n is not in the range between 16 and 25, the procedure proceeds to step #11 to set the count n to 25. This makes it possible to disable the attempt to keep exact synchronization in a situation where synchronization is utterly impossible due to corrupt data that may be received when the power has just been turned on. Then, the procedure proceeds to step #12.

If the count n is in the range between 16 and 25, the procedure proceeds directly to step #12. In step #12, the counter 5 attempts to detect a rising edge of the frame synchronization clock FSYNC. If it is not detected, the operation of step #12 is repeated until it is detected. If, in step #12, a rising edge of the frame synchronization clock FSYNC is detected, the counter 5 outputs the count n, and the procedure proceeds to step #13.

In step #13, the count n is used to subject, only once, the 19.2 MHz clock MCLK to $1/\{10-(25-n)\}$ frequency division by the programmable counter 8 (see FIG. 1). Thereafter, in step #7, the 19.2 MHz clock MCLK is subjected to $\frac{1}{10}$ frequency division by the programmable counter 8.

Note that the operation in step #10 restricts the count n within the range from 16 to 25. This range is wide enough to achieve exact synchronism, because the deviation between the bit clock BCLK and the reproduction clock RCLK corresponds to a count of at most 9 pulses in the 19.2 MHz clock MCLK, even if the frequency deviation of TCXO 6 is taken into consideration. Moreover, since the deviation between the clocks is corrected in synchronism with the frame synchronization clock FSYNC, it is possible to prevent accumulation of deviations resulting from the frequency deviation of the crystal-quartz oscillator due to variation of temperature.

In steps #6 and #13 of the above procedure, whether the obtained count is added to or subtracted from 10 in the denominator of the frequency division ratio is determined in accordance with the judgement result fed from the comparator 4 to the counter 8.

Figure 5:
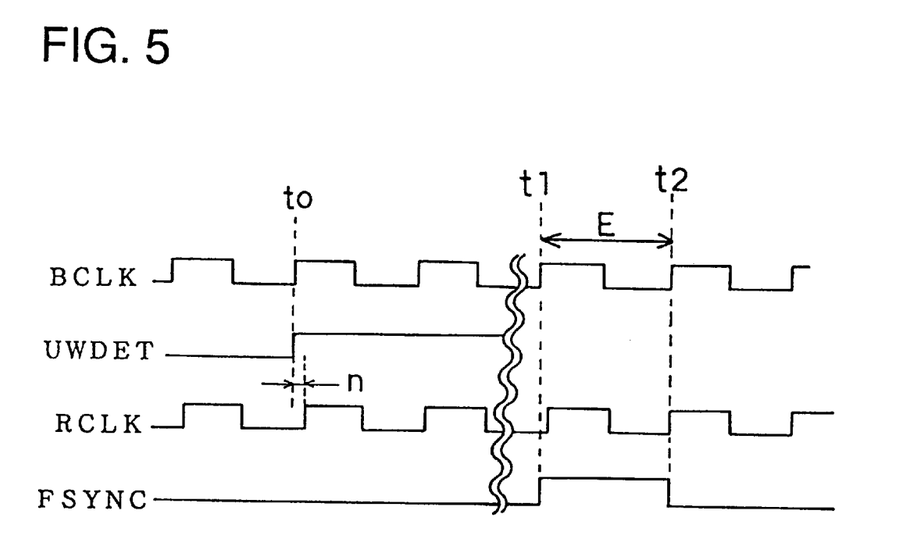
FIG. 5 is a diagram illustrating how an advanced bit clock is brought back into exact synchronism.
Figure 6:
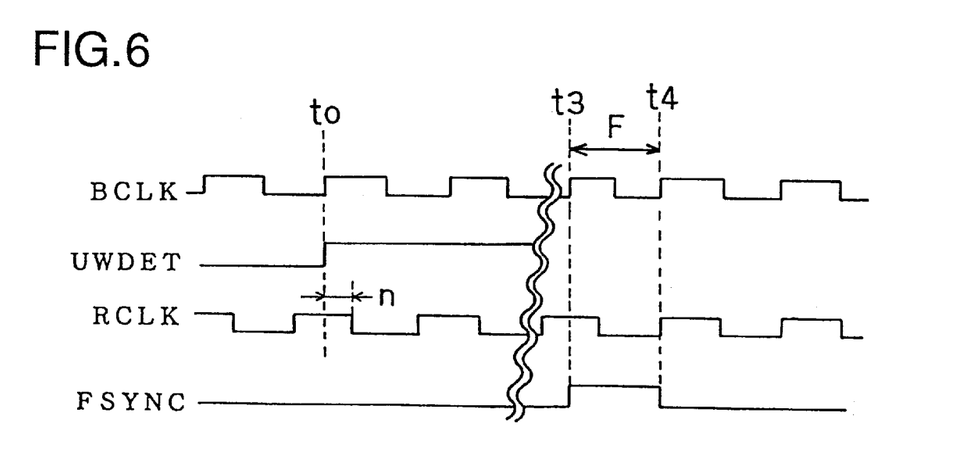
FIG. 6 is a diagram illustrating how a delayed bit clock is brought back into exact synchronism.

FIGS. 5 and 6 are waveform diagrams illustrating how the deviation between the clocks is corrected. FIG. 5 shows the case where the bit clock BCLK is advanced relative to the reproduction clock RCLK. As described previously, when the unique word detection signal UWDET rises at the time point t0, the deviation between the bit clock BCLK and the reproduction clock RCLK is determined by counting pulses in the clock MCLK. The obtained count n is stored.

When the frame synchronization clock FSYNC rises at the time point t1, the frequency division ratio of the programmable counter 8 (see FIG. 1) is changed. This causes the time period E to be extended by a length of time that corresponds to the count n. As a result, at the time point t2, the bit clock BCLK and the reproduction clock RCLK are brought into exact synchronism.

By contrast, FIG. 6 shows the case where the bit clock BCLK is delayed relative to the reproduction clock RCLK. When the unique word detection signal UWDET rises at the time point t0, the deviation between the bit clock BCLK and the reproduction clock RCLK is determined by counting pulses in the clock MCLK. The obtained count n is stored.

When the frame synchronization clock FSYNC rises at the time point t3, the frequency division ratio of the programmable counter 8 (see FIG. 1) is changed. This causes the time period F to be extended by a length of time that is calculated from the count n. As a result, at the time point t4, the bit clock BCLK and the reproduction clock RCLK are brought into exact synchronism. Note that, when the frequency division ratio of the programmable counter 8 (FIG. 1) is changed, the timing of the frame synchronization clock FSYNC is also changed.

In this way, in the relay station 62 shown in FIG. 7, signal processing is performed by the use a bit clock BCLK that is kept in exact synchronism with a signal transmitted from the base station 61. As a result, it is possible to obtain a data transfer clock having the same frequency and phase as used in the base station 61. This ensures reliable communication. Moreover, the portable terminal 63 can then treat the base station 61 and the relay station 62 with equity in terms of their signals. Furthermore, intervention of the relay station 62 no longer causes data errors.

Although FIG. 7 only shows the case where the base station 61 and the portable terminal 63 communicate with each other through one relay station 62, it is possible, even in cases where the base station 61 and the portable terminal 63 communicate through a plurality of relay stations 62, to keep the clock of each relay station 62 in exact synchronism with the clock of the base station 61 and, as a result, to perform reliable communication free of data error.

Moreover, it is also possible to incorporate the receiver circuit shown in FIG. 1 in the portable terminal 63 (FIG. 7). By so doing, it is possible, even in the portable terminal 63, to obtain a data transfer clock having the same frequency and phase as used in the base station 61, and thus to perform reliable communication.

The reason why the bit clock BCLK used by the signal processor 20 is produced within the above receiver circuit is as follows. The reproduction clock RCLK has the same frequency as the bit clock BCLK, but the former is available only intermittently. Specifically, in FIG. 2, when communication is performed, for example, through the first channel, the slots A1 and B1 are used; that is, if we consider reception alone here, only the slot B1 is used. Since the slot B1 occurs only once within one frame, it occurs intermittently with the passage of time, and therefore the data shown in FIG. 8 carried by the slot B1 is available intermittently (received once within each frame). The demodulator 3 has only to demodulate data that is received intermittently, and therefore it can operate by the use of the reproduction clock RCLK that is available intermittently. However, the signal processor 20 needs to perform signal processing continuously, and therefore it requires a continuous clock, that is, the bit clock. The present invention makes it possible to bring the bit clock in exact synchronism with the reproduction clock.

What is claimed is:

1. A receiver circuit for a mobile communications system, comprising:

demodulating means for demodulating a digital signal from a received radio-frequency signal;

reproduction clock producing means for producing a reproduction clock from the digital signal;

an oscillator for generating a clock;

a variable-ratio frequency divider for performing frequency division on the clock generated by the oscillator;

means for forming a bit clock from an output of the variable-ratio frequency divider;

a signal processor for processing the digital signal obtained from the demodulating means by use of the bit clock;

means for producing a frame synchronization signal from the output of the variable-ratio frequency divider;

means for generating a specific code detection signal in synchronism with the bit clock when a specific code is detected in the digital signal;

phase deviation detecting means, fed with the specific code detection signal and the reproduction clock, for detecting a phase deviation between the reproduction clock and the bit clock by measuring length of time that passes after the specific code detection signal is generated until the reproduction clock changes its level; and means for eliminating the phase deviation by, in response to the frame synchronization signal, temporarily changing a frequency division ratio of the variable-ratio frequency divider in accordance with amount of the phase deviation.

2. A receiver circuit as claimed in claim 1, wherein the receiver circuit constitutes a relay station in Personal Handyphone System.

3. A receiver circuit as claimed in claim 1, wherein the phase deviation detecting means comprises:
phase the phase deviation direction detecting means for detecting whether one clock is advanced or delayed relative to the other clock, and
phase deviation amount detecting means for detecting amount of the phase deviation.

4. A receiver circuit as claimed in claim 3, wherein the phase deviation direction detecting means detects whether the reproduction clock is in high-level or low-level state at a time point when the specific code detection signal is generated.

5. A receiver circuit as claimed is claim 3, wherein the phase deviation amount detecting means detects the amount of the phase deviation by counting pulses in the clock outputted from the oscillator during a period after the specific code detection signal is generated until the reproduction clock changes its level.

6. A receiver circuit for a mobile communications system, comprising:

demodulating means for intermittently demodulating a digital signal from an intermittently received radio-frequency signal;

reproduction clock producing means for producing an intermittent reproduction clock from the digital signal;

an oscillator for continuously generating a clock;

a variable-ratio frequency divider for performing frequency division on the clock generated by the oscillator;

means for forming a bit clock from an output of the variable-ratio frequency divider;

a signal processor for processing the digital signal obtained from the demodulating means by use of the bit clock;

means for producing a frame synchronazation signal from the output of the variable-ratio frequency divider;

means for generating a specific code detection signal in synchronism with the bit clock when a specific code is detected in the digital signal;

phase deviation detecting means, fed with the specific code detection signal and the reproduction clock, for detecting a phase deviation between the reproduction clock and the bit clock by measuring length of time that passes after the specific code detection signal is generated until the reproduction clock changes its level; and means for eliminating the phase deviation by, in response to the frame synchronization signal, temporarily changing a frequency devision ratio of the variable-ratio frequency divider in accordance with amount of the phase deviation.

* * * * *

UNITED STATES PATENT AND TRADEMARK OFFICE
CERTIFICATE OF CORRECTION

PATENT NO. : 5,946,358

DATED : August 31, 1999

INVENTOR(S) : Horimoto

It is certified that error appears in the above-identified patent and that said Letters Patent is hereby corrected as shown below:

```
On the title page,
     delete item [30], Oct. 16, 1899 [JP] Japan ........
8-273321, and insert -- Oct. 16, 1996 [JP] Japan ............
8-273321 --
```

Signed and Sealed this

First Day of February, 2000

Attest:

Q. TODD DICKINSON

Attesting Officer

Acting Commissioner of Patents and Trademarks